(12) United States Patent
Moniwa et al.

(10) Patent No.: US 7,714,314 B2
(45) Date of Patent: May 11, 2010

(54) SEMICONDUCTOR DEVICE AND METHOD OF MANUFACTURING THE SAME

(75) Inventors: Masahiro Moniwa, Tokyo (JP); Nozomu Matsuzaki, Tokyo (JP); Riichiro Takemura, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/775,474

(22) Filed: Jul. 10, 2007

(65) Prior Publication Data

US 2008/0011997 A1    Jan. 17, 2008

(30) Foreign Application Priority Data

Jul. 12, 2006    (JP)    ............... 2006-191331

(51) Int. Cl.
*H01L 29/02*    (2006.01)
*H01L 31/032*    (2006.01)

(52) U.S. Cl. ............ 257/4; 257/2; 257/5; 257/E29.002; 257/E31.029

(58) Field of Classification Search ............... 257/2, 257/4, 5, E29.002, E31.029
See application file for complete search history.

(56) References Cited

U.S. PATENT DOCUMENTS

| | | | |
|---|---|---|---|
| 6,391,750 B1 | 5/2002 | Chen et al. | |
| 7,071,485 B2 * | 7/2006 | Takaura et al. | 257/3 |
| 7,321,130 B2 * | 1/2008 | Lung et al. | 257/4 |
| 2006/0170031 A1 * | 8/2006 | Kang et al. | 257/315 |
| 2007/0230238 A1 * | 10/2007 | Schwerin et al. | 365/163 |

FOREIGN PATENT DOCUMENTS

| | | |
|---|---|---|
| JP | 2004-185755 | 7/2004 |
| JP | 2004-363586 | 12/2004 |
| JP | 2005-71500 | 3/2005 |
| JP | 2005-525690 | 8/2005 |
| WO | WO 03/021693 A2 | 3/2003 |

OTHER PUBLICATIONS

S.J. Ahn, et al., "Highly Manufacturable High Density Phase Change Memory of 64Mb and Beyond", IEEE, 2004, 4 Pages.
F. Pellizzer, et al., "Novel µ Trench Phase-Change Memory Cell for Embedded and Stand-Alone Non-Volatile Memory Applications", 2004 Symposium on VLSI Technology Digest of Technical Papers, pp. 18-19.

* cited by examiner

*Primary Examiner*—Victor A Mandala
(74) *Attorney, Agent, or Firm*—Oblon, Spivak, McClelland, Maier & Neustadt, L.L.P.

(57) ABSTRACT

A semiconductor device and a method of manufacturing the same with easy formation of a phase change film is realized, realizing high integration at the time of using a phase change film as a memory element.

Between MISFET of the region which forms one memory cell, and MISFET which adjoined it, each source of MISFET adjoins in the front surface of a semiconductor substrate, insulating. And the multi-layer structure of a phase change film, and the electric conduction film of specific resistance lower than the specific resistance is formed in the plan view of the front surface of a semiconductor substrate ranging over each source of both MISFET, and a plug and a plug stacked on it. The multi-layer structure functions as a wiring extending and existing in parallel on the surface of a semiconductor substrate, and an electric conduction film sends the current of a parallel direction on the surface of a semiconductor substrate.

8 Claims, 13 Drawing Sheets

SEMICONDUCTOR DEVICE AND METHOD OF MANUFACTURING THE SAME

CROSS-REFERENCE TO RELATED APPLICATION

The present application claims priority from Japanese patent application No. 2006-191331 filed on Jul. 12, 2006, the content of which is hereby incorporated by reference into this application.

FIELD OF THE INVENTION

This invention relates to the semiconductor device which mounts a phase change memory, and its manufacturing method.

DESCRIPTION OF THE BACKGROUND ART

A phase change memory is a resistance change type memory which has phase change films, such as chalcogenide semiconductor membrane, as a memory element. The phase change film can take reversibly the stable two phase of the amorphous (amorphous) state of high resistance, and a crystalline substance (crystalline) state of low resistance according to the heat application based on a current pulse. Therefore, by a phase change memory, memory of binary information is possible by the state of a phase.

As information on prior art documents relevant to invention of this application, some are following.

[Patent Reference 1] Japanese Unexamined Patent Publication No. 2004-185755

[Patent Reference 2] Japanese Unexamined Patent Publication No. 2004-363586

[Patent Reference 3] Japanese Unexamined Patent Publication No. 2005-71500

[Patent Reference 4] International Patent Publication No. W 2003-021693

[Nonpatent Literature 1] S. J. Ahn et al. and "Highly Manufacturable High Density Phase Change Memory of 64 Mb and Beyond" IEDM 2004, pp. 907-910

SUMMARY OF THE INVENTION

For example, in above-mentioned Patent Reference 3, chalcogenide layer 110 is shown in FIG. 4 (a)-(c). This chalcogenide layer 110 is formed with the fine pattern comparable as the line width of bit line BL and the width of source/drain active region 130 which were shown in the same drawing.

However, forming chalcogenide layer 110 in such a fine pattern is accompanied by the difficulty on a process. It is because phase change films, such as chalcogenide semiconductor membrane, are new materials including the heavy element of plural systems, and it is difficult to apply existing photolithography technology and etching technology to such an exotic material. Especially the thing for which dry etching is performed with sufficient controllability to a phase change film is difficult.

Such a problem will not be generated, when it is not a fine pattern and a phase change film can be comparatively formed in a large area. However, the high integration at the time of using as a memory element in that case will be restricted.

In above-mentioned Patent Reference 4, since the memory cell has taken pore structure, it has a recess in an upper electrode. Therefore, since a via plug cannot be arranged in the position of the same shaft as pore, it will be necessary to shift and arrange a via plug from pore, and a cell area will increase.

It is also difficult to use a phase change film not as a memory element but as a wiring. It is because the specific resistance of a phase change film is generally high compared with metaled specific resistance even if it is in a low resistance state.

This invention is made in view of the above-mentioned situation. It aims at offering a semiconductor device with easy formation of a phase change film, and its manufacturing method, realizing high integration at the time of using a phase change film as a memory element. It aims also at realizing a semiconductor device available as an upper wiring for the formative layer of a phase change film.

This invention is a semiconductor device which comprises a semiconductor substrate which has a front surface, a phase change film which was formed above the front surface of the semiconductor substrate and which can take an amorphous state and a crystalline substance state reversibly, and an electric conduction film which was formed above the front surface of the semiconductor substrate and which has specific resistance lower than specific resistance of the phase change film, wherein the phase change film and the electric conduction film form a multi-layer structure, the multi-layer structure functions as a wiring extending and existing in parallel with the front surface of the semiconductor substrate, and the electric conduction film sends current of a direction parallel to the front surface of the semiconductor substrate.

This invention is a method of manufacturing a semiconductor device which comprises the steps of (a) preparing a semiconductor substrate which has a front surface, (b) forming an element isolation film extending and existing banded in a first direction and adjoining a first and a second MISFET (Metal Insulator Semiconductor Field Effect Transistor) each of which has a gate extending and existing in a second different direction from the first direction, and a source and a drain which were formed in self align to the gate over an active region located between the element isolation films, over the front surface of the semiconductor substrate using film formation technology, photolithography technology, etching technology, and ion implantation technology, (c) forming a first and a second plug which connect with each source of the first and the second MISFET, respectively using film formation technology, photolithography technology and etching technology, or film formation technology and film planarizing technology, and (d) forming a multi-layer structure connected to both the first and the second plug, of a phase change film which can take an amorphous state and a crystalline substance state reversibly and an electric conduction film which has specific resistance lower than specific resistance of the phase change film, using film formation technology, photolithography technology, and etching technology, wherein in the step (b), in the front surface of the semiconductor substrate, each source of the first and the second MISFET is arranged vacating a predetermined distance, and in the step (d), the multi-layer structure is formed ranging over the first and the second plug so that it is extending and existing banded in the second direction in a plan view of the front surface of the semiconductor substrate.

According to the semiconductor device concerning the present invention, a phase change film, and the electric conduction film which has specific resistance lower than the specific resistance of a phase change film form a multi-layer structure. A multi-layer structure functions as a wiring extending and existing in parallel on the surface of a semiconductor substrate, and an electric conduction film sends the current of a parallel direction on the surface of a semiconductor substrate. Therefore, an electric conduction film will bear the main function of a wiring among the multi-layer structures of a phase change film and an electric conduction film, and a semiconductor device available considering the formative layer of a phase change film as an upper wiring can be realized.

According to the manufacturing method of the semiconductor device concerning the present invention, in the front surface of a semiconductor substrate, each source of first and second MISFET vacates a predetermined distance, and is arranged. In the forming step of the multi-layer structure of a phase change film and an electric conduction film, in the plan view of the front surface of a semiconductor substrate, a multi-layer structure is formed banded ranging over the first and a second plug so that it may extend and exist to the extending direction of the gate. Therefore, the formation area of a phase change film is wide, and even if it is a case where it is integrated highly, formation of a phase change film is easy.

DETAILED DESCRIPTION OF THE PREFERRED EMBODIMENTS

Embodiment 1

This embodiment is the semiconductor device which adopted the multi-layer structure of the phase change film which can take reversibly the two phase of an amorphous state and a crystalline substance state, and the electric conduction film which has specific resistance lower than the specific resistance of a phase change film, and its manufacturing method. The semiconductor device concerning this embodiment is a memory cell array type phase change memory.

Figure 1:
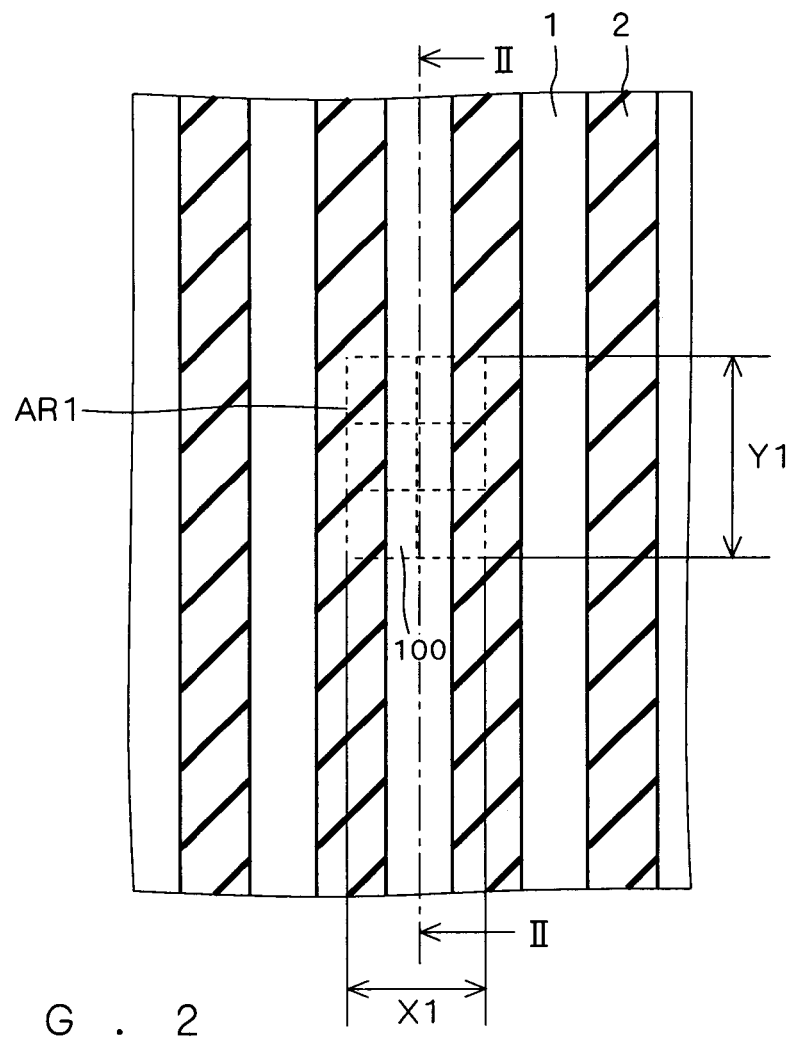
FIG. 1 is a top view showing one step of the manufacturing method of the semiconductor device concerning Embodiment 1.
Figure 2:
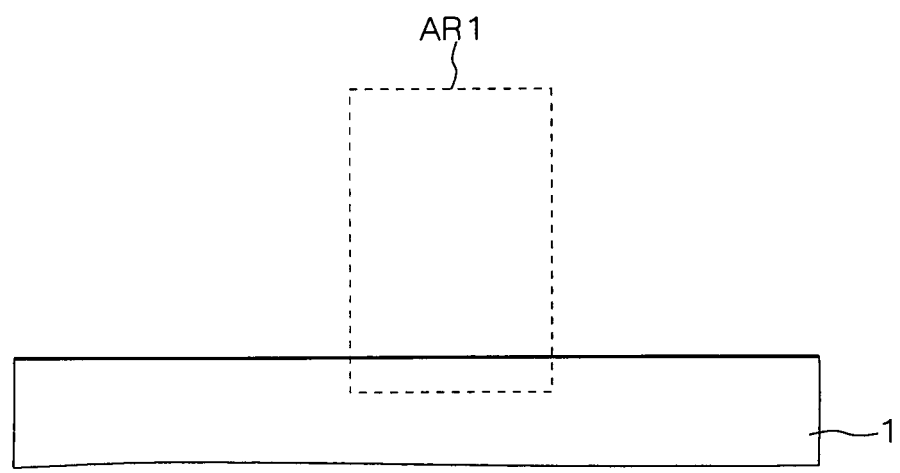
FIG. 2 is a cross-sectional view showing one step of the manufacturing method of the semiconductor device concerning Embodiment 1.
Figure 4:
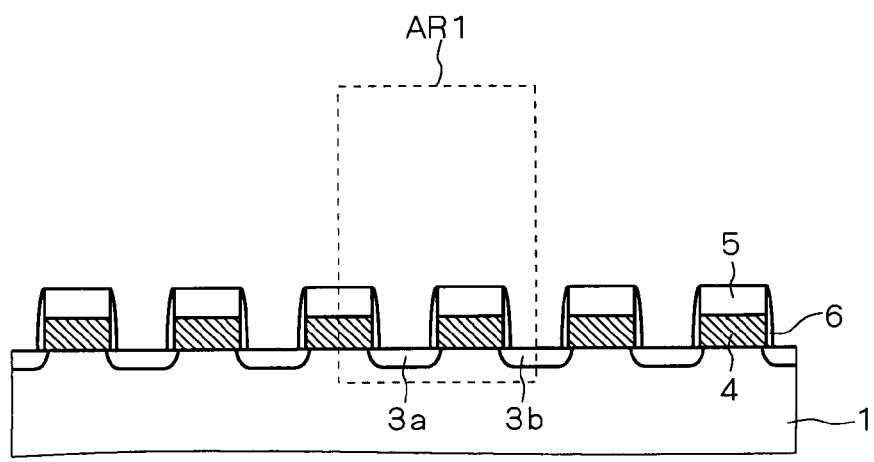
FIG. 4 is a cross-sectional view showing one step of the manufacturing method of the semiconductor device concerning Embodiment 1.
Figure 5:
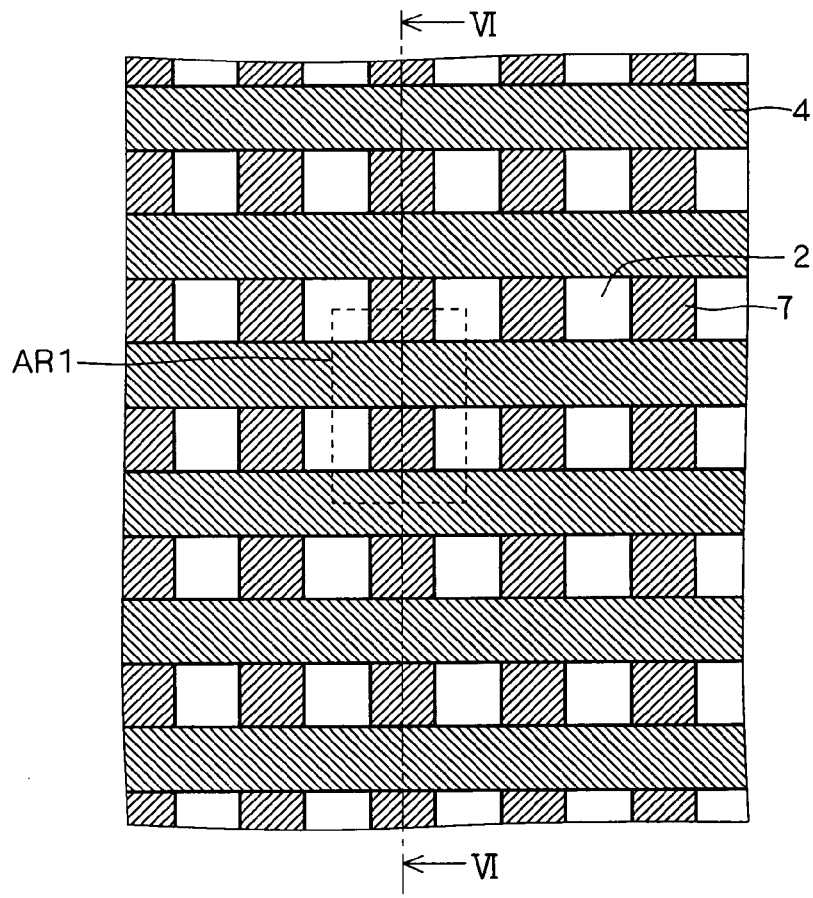
FIG. 5 is a top view showing one step of the manufacturing method of the semiconductor device concerning Embodiment 1.
Figure 6:
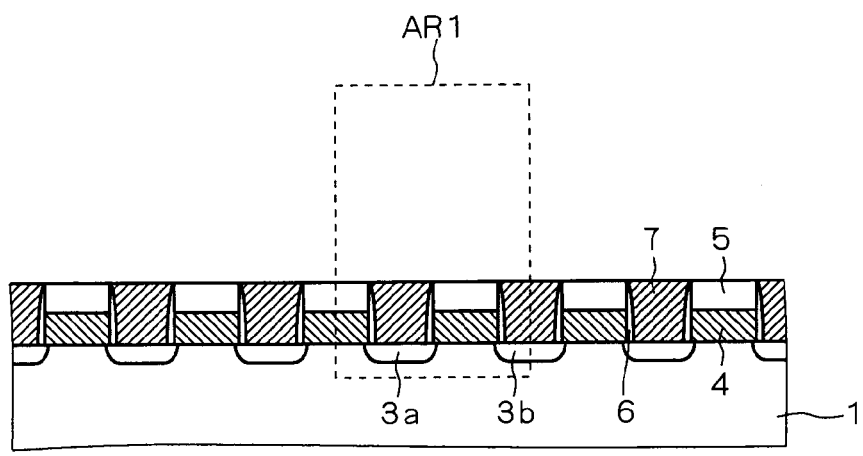
FIG. 6 is a cross-sectional view showing one step of the manufacturing method of the semiconductor device concerning Embodiment 1.
Figure 10:
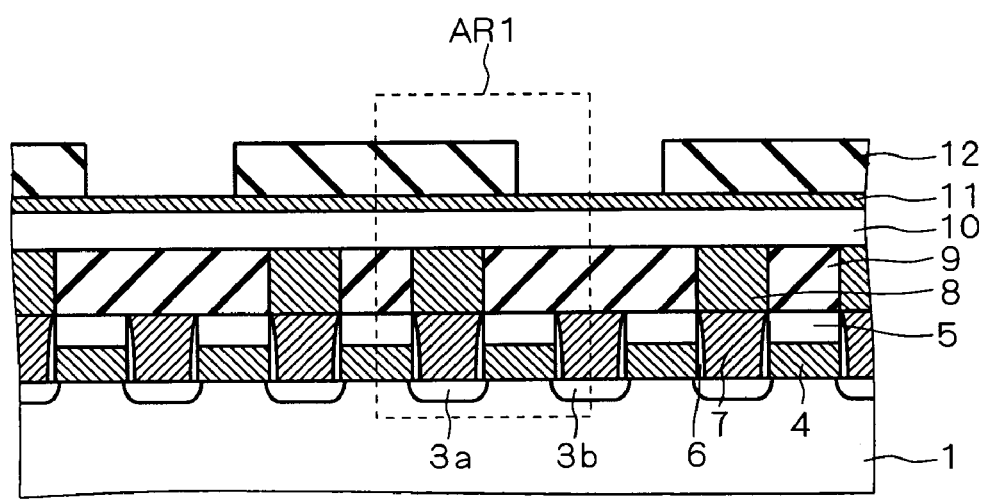
FIG. 10 is a cross-sectional view showing one step of the manufacturing method of the semiconductor device concerning Embodiment 1.
Figure 11:
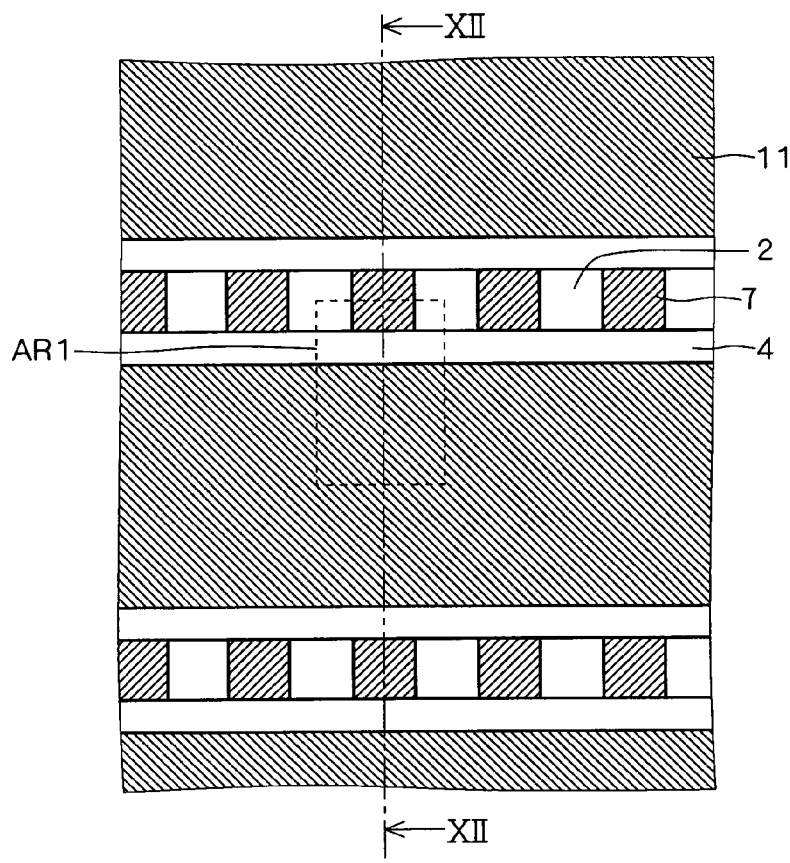
FIG. 11 is a top view showing one step of the manufacturing method of the semiconductor device concerning Embodiment 1.
Figure 12:
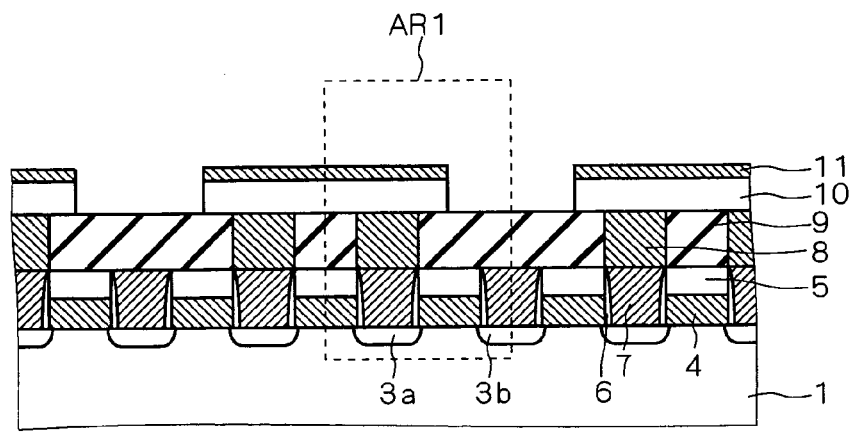
FIG. 12 is a cross-sectional view showing one step of the manufacturing method of the semiconductor device concerning Embodiment 1.
Figure 13:
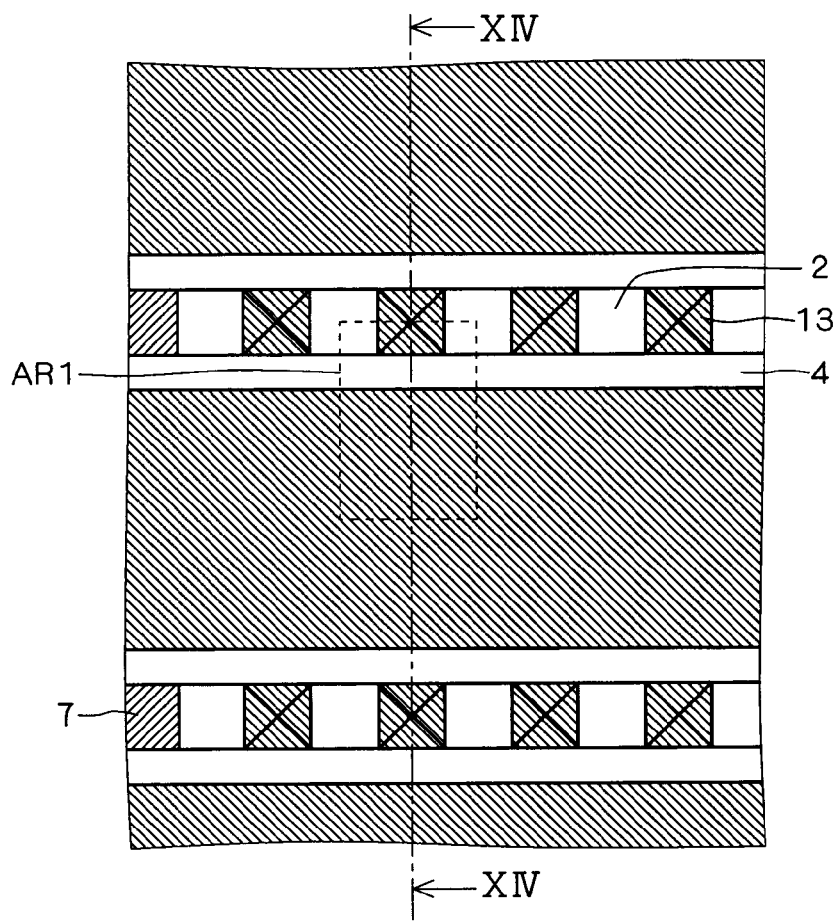
FIG. 13 is a top view showing one step of the manufacturing method of the semiconductor device concerning Embodiment 1.
Figure 14:
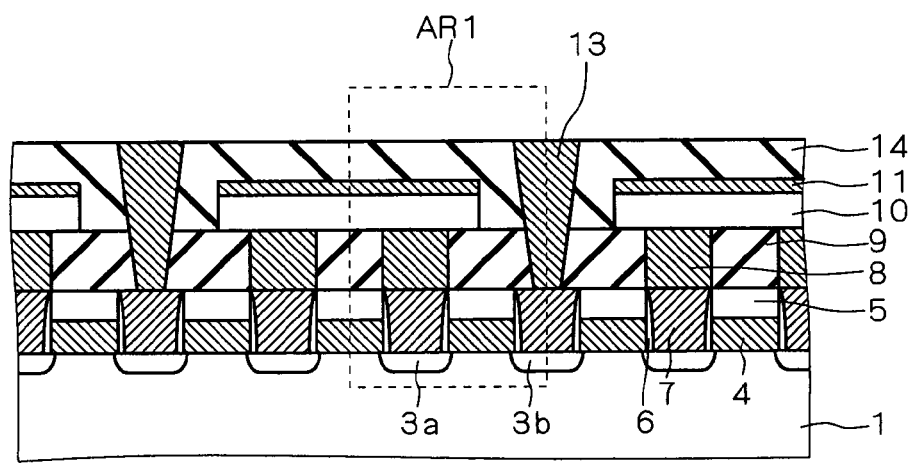
FIG. 14 is a cross-sectional view showing one step of the manufacturing method of the semiconductor device concerning Embodiment 1.
Figure 15:
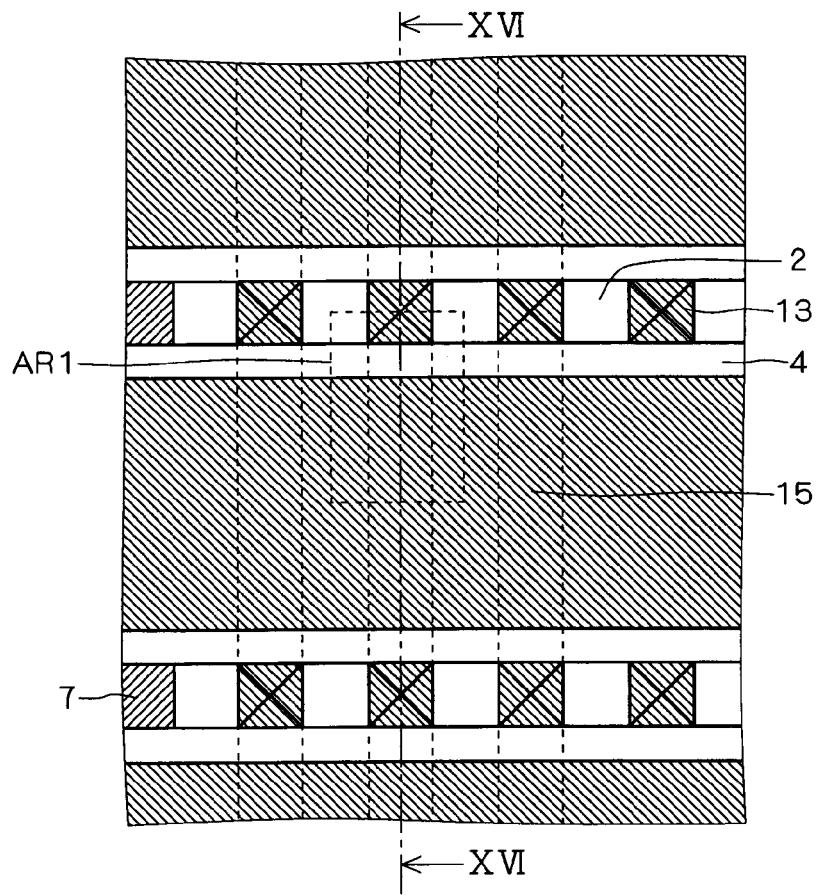
FIG. 15 is a top view showing the semiconductor device concerning Embodiment 1.
Figure 16:
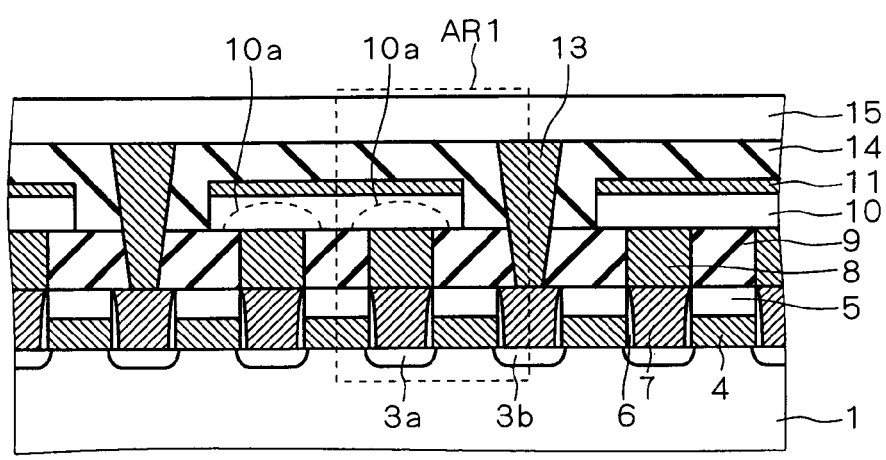
FIG. 16 is a cross-sectional view showing the semiconductor device concerning Embodiment 1.
Figure 17:
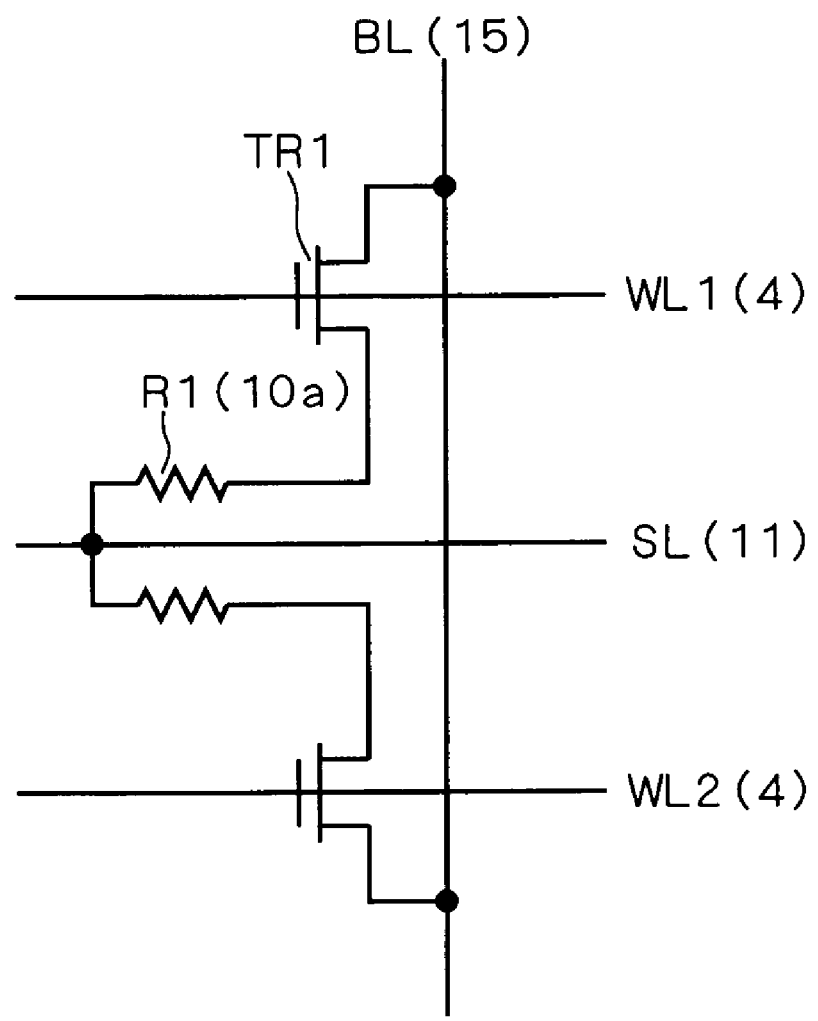
FIG. 17 is a circuit diagram of the memory cell of the semiconductor device concerning Embodiment 1.

FIG. 1, FIG. 3, FIG. 5, FIG. 7, FIG. 11, FIG. 13, and FIG. 15 are the top views showing one step of the manufacturing method of the semiconductor device concerning this embodiment. FIG. 2, FIG. 4, FIG. 6, FIG. 8, FIG. 9, FIG. 10, FIG. 12, FIG. 14, and FIG. 16 are the cross-sectional views showing one step of the manufacturing method of the semiconductor device concerning this embodiment. FIG. 15 is a top view showing the semiconductor device concerning this embodiment, FIG. 16 is a cross-sectional view showing the semiconductor device concerning this embodiment, and FIG. 17 is a circuit diagram of the memory cell of the semiconductor device concerning this embodiment. FIG. 2 shows the section in cutting plane line II-II in FIG. 1, and FIG. 4 shows the section in cutting plane line IV-IV in FIG. 3. FIG. 6 shows the section in cutting plane line VI-VI in FIG. 5, and FIG. 8 shows the section in cutting plane line VIII-VIII in FIG. 7. FIG. 12 shows the section in cutting plane line XII-XII in FIG. 11, FIG. 14 shows the section in cutting plane line XIV-XIV in FIG. 13, and FIG. 16 shows the section in cutting plane line XVI-XVI in FIG. 15.

First, as shown in FIG. 1 and FIG. 2, semiconductor substrates 1, such as a silicon substrate, are prepared and a plurality of element isolation films 2, such as a silicon oxide film, are formed in the front surface by a trench isolation method etc. Element isolation film 2 has the function to insulate MISFET (Metal Insulator Semiconductor Field Effect Transistor) formed later. In the plan view of the front surface of semiconductor substrate 1, it arranges banded in the pitch of 2F ("F" is the so-called minimum feature size). That is, MISFET is arranged on the active region between a plurality of element isolation films 2.

Region AR1 shown in FIG. 1 and FIG. 2 is a formation area of one cell of a phase change memory. The plane size of region AR1 is a size (namely, "$6F^2$") into which square (so-called "$F^2$") 100 which makes the minimum feature size one side enters by six pieces.

Figure 3:
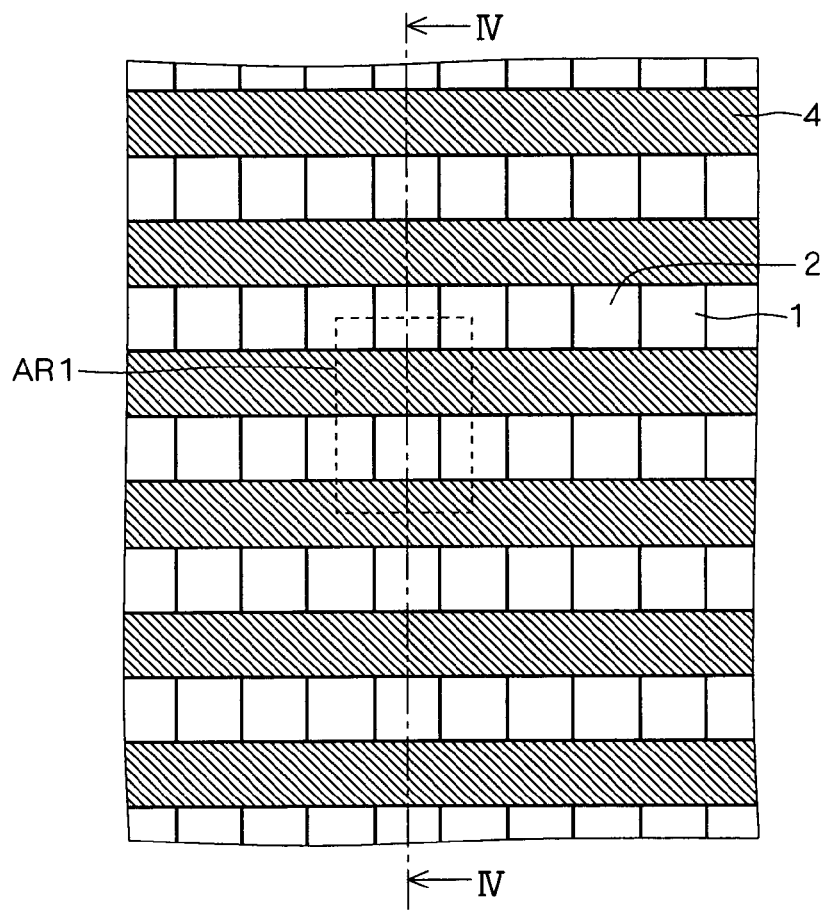
FIG. 3 is a top view showing one step of the manufacturing method of the semiconductor device concerning Embodiment 1.

Next, as shown in FIG. 3 and FIG. 4, film formation technology, such as the CVD (Chemical Vapor Deposition) method and a sputtering technique, the photolithography technology which patterns photoresist by exposing selectively to photoresist, dry and wet etching technology, and ion implantation technology are used. A plurality of MISFET (Metal Insulator Semiconductor Field Effect Transistor) each of which has gate (for example, silicon gate) 4 extended and existed in the pitch of 2F in the direction which intersects perpendicularly with the extending direction of element isolation film 2, gate upper insulating film (for example, silicon nitride film) 5 and side wall insulating film 6 (for example, silicon nitride film), and source 3a and drain 3b which were formed in the front surface of semiconductor substrate 1 in self align to gate 4 and gate upper part insulating film 5, are formed adjacently. In formation of above-mentioned element isolation film 2 and a plurality of above-mentioned MISFET, the phase shift exposing methods, such as the Levenson type, are used.

Drain 3b is shared among source 3a and drain 3b between two MISFET which adjoins the extending direction of element isolation film 2. On the other hand, in the front surface of semiconductor substrate 1, each source 3a of two adjoining MISFET is arranged so that it may adjoin insulating. Namely, in the front surface of semiconductor substrate 1, each source 3a of two MISFET, MISFET of region AR1, and MISFET (in FIG. 4, it is MISFET on the left of region AR1) which adjoined is arranged vacating a predetermined distance (gate length grade of gate 4), and is separated by Electric Field Isolation Method by gate 4 in which it is located between them. In FIG. 3 and subsequent top views, in order to avoid the complicatedness of a display, hatching of element isolation film 2 is removed.

Next, as shown in FIG. 5 and FIG. 6, plug 7 which connects with source 3a and drain 3b, respectively is formed. What is necessary is just to adopt a tungsten film as this plug 7, for example. What is necessary is just to perform formation of plug 7 using film formation technology, such as a sputtering technique, and film planarizing technology, such as CMP (Chemical Mechanical Polishing). Although not shown in FIG. 5 and subsequent top views, on element isolation film 2, interlayer insulation films, such as a silicon oxide film, are formed. Plug 7 may be formed using film formation technology, photolithography technology, and etching technology. Also in formation of plug 7, the Levenson type phase shift exposing method is used.

Figure 7:
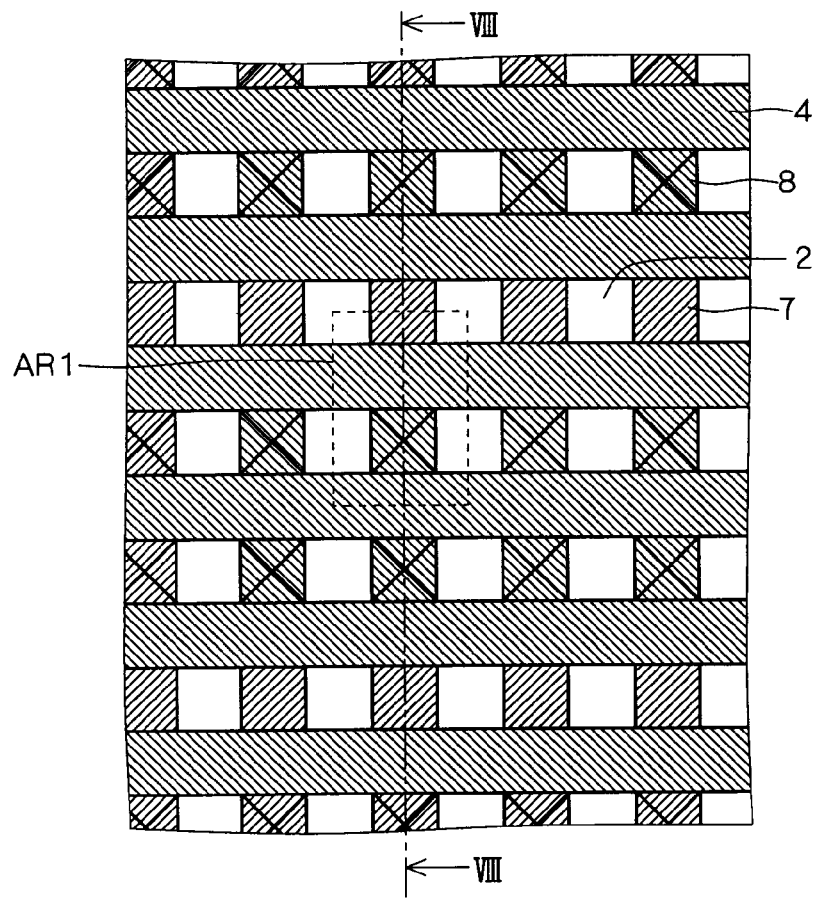
FIG. 7 is a top view showing one step of the manufacturing method of the semiconductor device concerning Embodiment 1.
Figure 8:
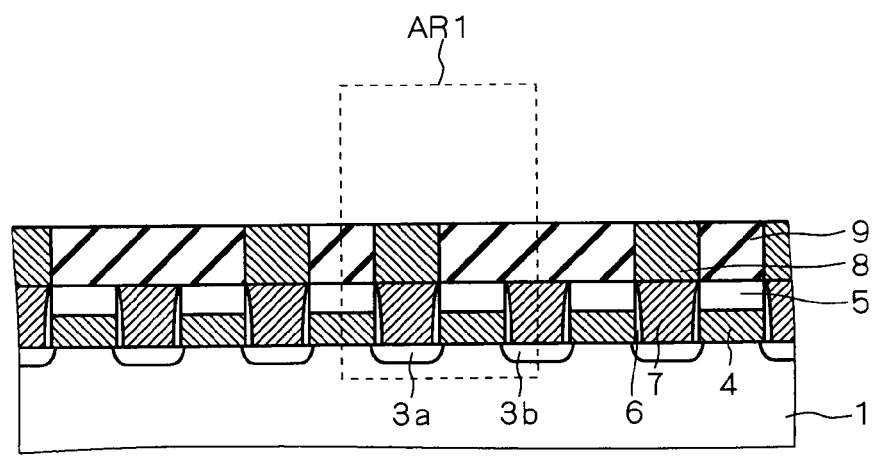
FIG. 8 is a cross-sectional view showing one step of the manufacturing method of the semiconductor device concerning Embodiment 1.

Next, as shown in FIG. 7 and FIG. 8, interlayer insulation films 9, such as a silicon oxide film, are formed on gate upper part insulating film 5 and plug 7. An opening is made in interlayer insulation film 9 selectively, and plug 8 is formed in the opening. The formation part of plug 8 is on plug 7 connected with source 3a among source 3a and drain 3b. Both plug 8 and plug 7 function as plugs which connect each source 3a of MISFET, and the below-mentioned phase change film 10, respectively. In FIG. 7, the rectangular head with a diagonal line shows plug 8. What is necessary is just to adopt for example, a tungsten film as plug 8 as well as plug 7.

Formation of plug 8 may also be performed by the damascene wiring method having used film formation technology, such as Cu-plating, and film planarizing technology, such as CMP. Plug 8 may be formed using film formation technology, photolithography technology, and etching technology. Also in formation of plug 8, the Levenson type phase shift exposing method is used.

Figure 9:
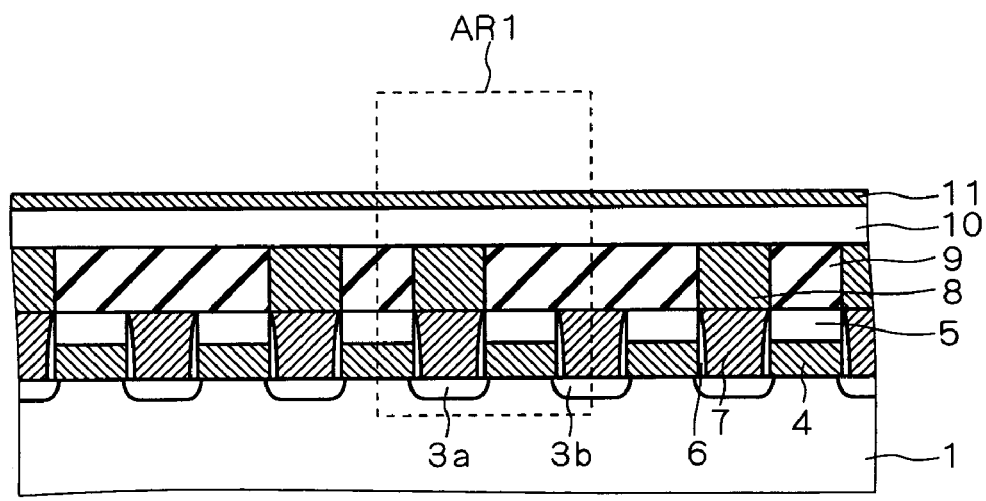
FIG. 9 is a cross-sectional view showing one step of the manufacturing method of the semiconductor device concerning Embodiment 1.

Next, as shown in FIG. 9, using film formation technology, such as a CVD method or a sputtering technique, in the whole surface on interlayer insulation film 9 and plug 8, the multi-layer structure of phase change film 10 which can take reversibly the two phase of an amorphous state and a crystalline substance state and electric conduction film 11 which has specific resistance lower than the specific resistance of phase change film 10 is formed. What is necessary is to adopt chalcogenide semiconductor membrane, such as a $Ge_XSb_Y$-$Te_Z$ (GST) film, as phase change film 10, and just to adopt a tungsten film as electric conduction film 11. Also in formation of phase change film 10 and electric conduction film 11, the Levenson type phase shift exposing method is used.

And as shown in FIG. 10, photoresist 12 is formed on electric conduction film 11 using photolithography technology, and patterning for source wiring is performed. Then, it patterns the multi-layer structure of phase change film 10 and electric conduction film 11 using etching technology, such as plasma dry etching, using photoresist 12 as a mask, as shown in FIG. 11 and FIG. 12. Hereby, the multi-layer structure of phase change film 10 and electric conduction film 11 extends and exists in the direction which intersects perpendicularly with the extending direction of element isolation film 2. In the plan view of the front surface of semiconductor substrate 1, plug 8 and plug 7 connected to each sources 3a of two MISFET which adjoins the extending direction of element isolation film 2, and those sources 3a will be straddled.

Namely, in the semiconductor device concerning this embodiment, let two MISFET, MISFET of region AR1, and MISFET (in FIG. 12, it is MISFET on the left of region AR1) which adjoined it, and plug 8 and plug 7 connected to each source 3a of these two MISFET be a set. It has two or more sets of such structures so that a predetermined distance may be vacated for the extending direction of gate 4 and it may be adjoined, and each multi-layer structure of phase change film 10 and electric conduction film 11 is both arranged banded in the plan view of the front surface of semiconductor substrate 1. And it connects with two or more sets of plugs 8 which vacate a predetermined distance for the extending direction of gate 4, and adjoin it, and the multi-layer structure of phase change film 10 and electric conduction film 11 functions as a wiring extending and existing in parallel with the front surface of semiconductor substrate 1. Electric conduction film 11 has the function to send the current of a direction parallel to the front surface of semiconductor substrate 1. In FIG. 11 and subsequent top views, in order to avoid the complicatedness of a display, hatching of gate 4 is removed.

In this embodiment, element isolation film 2, gate 4 of each MISFET, and the multi-layer structure of phase change film 10 and electric conduction film 11 are arranged by each banded with a fixed pitch in the plan view of the front surface of semiconductor substrate 1. Plug 8 and plug 7 are arranged in the fixed pitch in the plan view of the front surface of semiconductor substrate 1 at the intersection of the active region located between element isolation films 2, and the space between gates 4.

Then, as shown in FIG. 13 and FIG. 14, interlayer insulation films 14, such as a silicon oxide film, are formed with a CVD method etc. so that the multi-layer structure of phase change film 10 and electric conduction film 11 and interlayer insulation film 9 may be covered. With photolithography technology and etching technology, the contact hole which reaches drain 3b among source 3a and drain 3b is formed in interlayer insulation film 9 and 14. And plug 13 connected to drain 3b is formed in the contact hole concerned. What is necessary is just to adopt a tungsten film as this plug 13, for example. Formation of plug 13 may also be performed by the damascene wiring method having used film formation technology, such as Cu-plating, and film planarizing technology, such as CMP.

And as shown in FIG. 15 and FIG. 16, banded tungsten film (it functions as a bit line) 15 connected to plug 13 is formed in the pitch of 2F using film formation technology, photolithography technology, and etching technology. Although other metallic materials, i.e., copper, aluminum, etc. are applicable as a material of a bit line, since finer processing is possible, tungsten is preferred. Then, when forming the upper interlayer insulation film, a wiring (not shown), etc. further according to need, the semiconductor device concerning this embodiment will be completed.

In the semiconductor device of this embodiment, let two MISFET of MISFET of region AR1, and MISFET (in FIG. 16, it is MISFET on the left of region AR1) which adjoined it, and plug 8 and plug 7 connected to each source 3a of these 2MISFET be a set. It has two or more sets of such structures, and gate 4 of each MISFET in two or more of the sets is a word line, and the portion 10a connected to plug 8 of phase change film 10 is a memory element in two or more of these sets.

Two resistor elements R1 (the portion 10a connected to plug 8 of phase change film 10) which connect with each source of MISFET of region AR1, and MISFET (in FIG. 17, all are transistors TR1) which adjoined it, respectively, as shown in FIG. 17, function as a memory element of a memory cell. Electric conduction film 11 functions as source line SL which sends the current of a direction parallel to the front surface of semiconductor substrate 1. And gate 4 of each transistor TR1 functions as word line WL1 and WL2, and tungsten film 15 which electrically connects to a drain and is extended and existed to the extending direction of element isolation film 2 functions as bit line BL. And word line WL1 and WL2 cross at right angles to bit line BL, and are arranged in parallel to source line SL.

According to the semiconductor device concerning this embodiment, and its manufacturing method, between two MISFET, MISFET of region AR1, and MISFET (in FIG. 16, it is MISFET on the left of region AR1) which adjoined it, in the front surface of semiconductor substrate 1, each source 3a of MISFET vacates a predetermined distance, and adjoins. In the forming step of the multi-layer structure of phase change film 10 and electric conduction film 11, in the plan view of the front surface of semiconductor substrate 1, ranging over each source 3a of MISFET of region AR1, and MISFET which adjoined it, and plug 8 and plug 7, a multi-layer structure is formed banded so that it may extend and exist to the extending direction of gate 4. Therefore, even if it is a case where the formation area of phase change film 10 was wide, and is integrated highly, formation of phase change film 10 is easy. For example, also when element isolation film 2 and gate 4 are formed in the pitch of 2F and one cell is integrated highly to $6F^2$, a phase change film can be formed in the pitch of 6F.

As especially shown in FIG. 11, FIG. 13, and FIG. 15, in the plan view of the front surface of semiconductor substrate 1, phase change film 10 and electric conduction film 11 are formed in the large area. Phase change films 10, such as chalcogenide semiconductor membrane, are exotic materials including the heavy element of plural systems. Therefore, it is difficult to apply the existing photolithography technology and the etching technology for fine pattern formation, for example to fine pattern formation of 2F pitch. However, when it is a large area of 6F pitch in this way, it is not necessary to make it a fine pattern, and manufacture will become easy.

According to the manufacturing method of the semiconductor device concerning this embodiment, in formation of element isolation film 2, gate 4, plug 8, and plug 7, the phase shift exposing methods, such as the Levenson type, are used. This is because all of element isolation film 2, gate 4, plug 7, and plug 8 are arranged in a fixed pitch. Therefore, lower layer MISFET, and plug 8 and plug 7 can be formed minutely, and, on the other hand, the formation area of phase change film 10 can be made wide. Therefore, the fine memory cell of $6F^2$ and a phase change film with easy manufacture can be reconciled.

According to the semiconductor device concerning this embodiment, and its manufacturing method, phase change film 10, and electric conduction film 11 which has specific resistance lower than the specific resistance of phase change film 10 form a multi-layer structure. A multi-layer structure functions as a wiring extending and existing in parallel with the front surface of semiconductor substrate 1, and electric conduction film 11 sends the current of a direction parallel to the front surface of semiconductor substrate 1. Therefore, electric conduction film 11 will bear the main function of a wiring among the multi-layer structures of phase change film 10 and electric conduction film 11, and a semiconductor device available as an upper wiring can be realized for the formative layer of phase change film 10. By using phase change film 10 as a wiring layer, the via hole layer and wiring layer which had connected with it conventionally become unnecessary, and the reduction (for example, two sheets) of mask number of sheets of them is attained. By it, the decrease of mask cost, the improvement in an output throughput by process number reduction, the decrease of the number of equipment required for output, and the defective suppression generated in the layer concerned are attained, and cost can be reduced. Since the via hole connected to an upper electrode becomes unnecessary also when pore structure is adopted, the problem of cell area increase is solved.

According to the semiconductor device concerning this embodiment, each source 3a of two MISFET which adjoins in the extending direction of element isolation film 2 adjoins towards intersecting perpendicularly with the extending direction of each gate 4 of two MISFET concerned (extending direction of element isolation film 2). It has two or more sets of lots of two MISFET concerned, and plug 8 and plug 7 connected to each source of these two MISFET so that a predetermined distance may be vacated for the extending direction of gate 4 and it may be adjoined. Both, in the plan view of the front surface of semiconductor substrate 1, the multi-layer structure of phase change film 10 and electric conduction film 11 is arranged banded so that it may extend and exist to the extending direction of gate 4. Generally, when the film is formed as a pattern with fine island form etc., it will be easy to generate the problem of falling by photoresist at the time of photolithography technical utilization. However, like the present invention, when two or more sets of each multi-layer structures are both arranged banded in the plan view of the front surface of semiconductor substrate 1, it will be hard to generate the problem of falling by photoresist. Therefore, even if it is a case where it is integrated highly, formation of phase change film 10 is easy. According to the semiconductor device concerning this embodiment, it is effective in being hard to generate falling by resist by having used element isolation as the stripe (banded) pattern as it will mention later. However, it is an exotic material of a heavy element, etching is difficult, and since the thickness enhancement of resist is required for a $Ge_XSb_YTe_Z$ (GST) film pattern, it is especially effective.

According to the semiconductor device concerning this embodiment, it has bit line BL and each MISFET is arranged on the front surface of semiconductor substrate 1 in the shape of an array. Each multi-layer structure of phase change film 10 and electric conduction film 11 is source line SL, gates 4 of each MISFET are word line WL1 and WL2, and portion 10a connected to plug 8 of phase change film 10 is a memory element. And bit line BL and word line WL1 and WL2 cross at right angles, and, as for source line SL, the word line is arranged in parallel. Here, while extending and existing a bit line in the different direction from a word line for cell selection, electric potential differs for every bit line, and an adjoining bit line cannot be shared. Therefore, this embodiment is sharing the source line. Therefore, in the memory cell using phase change film 10, a semiconductor device with easy formation of phase change film 10 is realizable.

According to the semiconductor device concerning this embodiment, a plurality of element isolation films 2 insulate MISFET of region AR1, and MISFET which adjoined in the extending direction of gate 4 between two or more sets of the above which vacates a predetermined distance for the extending direction of gate 4, and adjoins it. That is, in the plan view of the front surface of semiconductor substrate 1, a plurality of element isolation films 2 are arranged banded so that it may intersect perpendicularly with the extending direction of gate 4. In the front surface of semiconductor substrate 1, each source of MISFET of region AR1 and MISFET which adjoined in the extending direction of element isolation film 2 vacates a predetermined distance, is arranged, and is separated by Electric Field Isolation Method by gate 4 in which it is located between them. Therefore, separation between elements can be aimed at, arranging an element densely.

According to the semiconductor device concerning this embodiment, element isolation film 2, the gate 4 of each MISFET, and the multi-layer structure of phase change film 10 and electric conduction film 11 are arranged by each banded in a fixed pitch in the plan view of the front surface of semiconductor substrate 1. Plug 8 and plug 7 are arranged in the fixed pitch in the plan view of the front surface of semiconductor substrate 1 at the intersection of the active region located between element isolation films 2, and the space between gates 4. Therefore, the structure form of an element is simple, it is easy to do microfabrication, and the phase shift exposing methods, such as the Levenson type, can be used effectively. Since the multi-layer structure of phase change film 10 and electric conduction film 11 is formed broadly here, it is not necessary to necessarily use the phase shift exposing methods, such as the Levenson type, in this embodiment. However, it may form from the request of microfabrication, dimensional accuracy, etc. using the phase shift exposing methods, such as the Levenson type.

Embodiment 2

This embodiment is a modification of the semiconductor device concerning Embodiment 1. The multi-layer structure of phase change film 10 and electric conduction film 11 in Embodiment 1 is used as a general wiring layer, without limiting to the source line of a memory cell.

Figure 18:
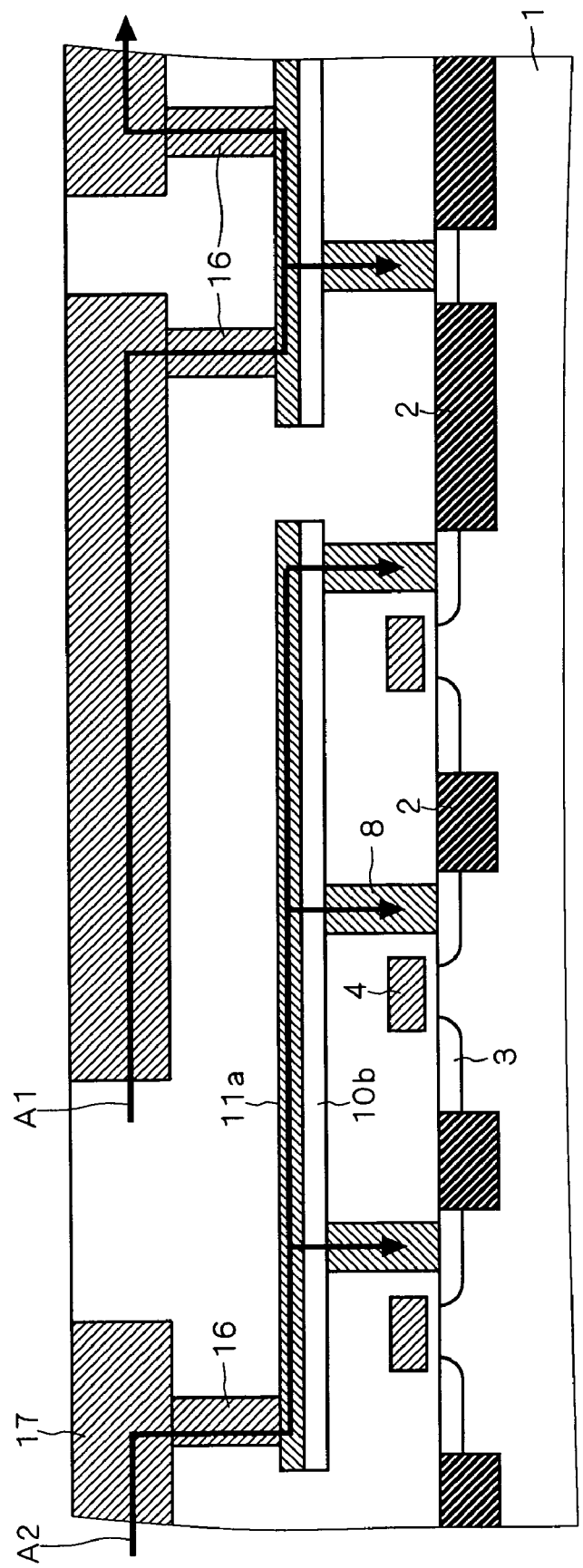
FIG. 18 is a cross-sectional view showing the semiconductor device concerning Embodiment 2.

FIG. 18 is a cross-sectional view showing the semiconductor device concerning this embodiment. Also in this semiconductor device, a plurality of MISFET which has a plurality of element isolation films 2, such as a silicon oxide film, and a source or drain 3, and gate 4, respectively is formed in the front surface of semiconductor substrates 1, such as a silicon substrate. And plug 8 is connected to either the source or drain 3 in each MISFET.

Phase change film 10b connected to plug 8 which are chalcogenide semiconductor membrane, such as a $Ge_xSb_yTe_z$ (GST) film, is formed above the front surface of semiconductor substrate 1. Electric conduction films 11a which have specific resistance lower than the specific resistance of phase change film 10b, such as a tungsten film, are formed on phase change film 10b. And phase change film 10b and electric conduction film 11a form a multi-layer structure, and this multi-layer structure functions as a wiring extending and existing in parallel with the front surface of semiconductor substrate 1. Unlike the case of Embodiment 1, as for this multi-layer structure, it is good not to be what functions as a source line, and it should just function as a general wiring. Namely, phase change film 10b is formed above the front surface of semiconductor substrate 1, electric conduction film 11a which has specific resistance lower than the specific resistance of phase change film 10b is formed on phase change film 10b, and phase change film 10b and electric conduction film 11a should just form the multi-layer structure.

On electric conduction film 11a, plug 16 for copper via holes connected to one main surface of electric conduction film 11a is formed, and copper wiring films 17 are formed on plug 16. Electric conduction film 11a passes current A2 and A1 through wiring film 17 and plug 16 of a direction parallel to the front surface of semiconductor substrate 1.

Also in the semiconductor device concerning this embodiment, phase change film 10b, and electric conduction film 11a which has specific resistance lower than the specific resistance of phase change film 10b form a multi-layer structure. This multi-layer structure functions as a wiring extending and existing in parallel with the front surface of semiconductor substrate 1, and electric conduction film 11a passes current A1 and A2 of a direction parallel to the front surface of semiconductor substrate 1. Therefore, electric conduction film 11a will bear the main function of a wiring among the multi-layer structures of phase change film 10b and electric conduction film 11a, and a semiconductor device available as an upper wiring can be realized for the formative layer of phase change film 10b.

Embodiment 3

This embodiment is a modification of the semiconductor device concerning Embodiment 2. Instead of copper plug 16 for via holes of Embodiment 2, the plug for via holes of high melting point metals, such as tungsten which is a high melting point more, is adopted.

Figure 19:
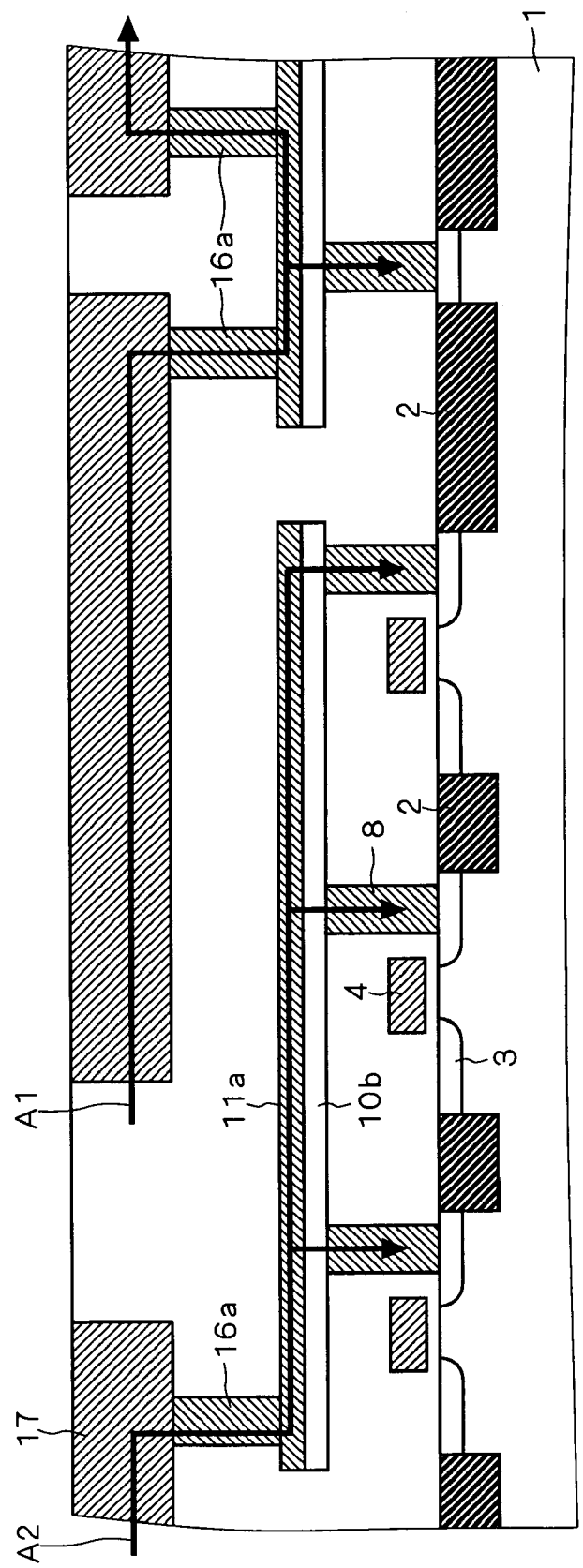
FIG. 19 is a cross-sectional view showing the semiconductor device concerning Embodiment 3.

FIG. 19 is a cross-sectional view showing the semiconductor device concerning this embodiment. In FIG. 19, device structure is the same as FIG. 18 except the point that copper plugs 16 of FIG. 18 are changed into plug 16a for via holes of high melting point metals, such as tungsten.

When phase change films 10b are chalcogenide semiconductor membrane, such as a $Ge_xSb_yTe_z$ (GST) film, the melting point is about 600-degrees Centigrade. On the other hand, in the case of tungsten as an example of a high melting point metal, the melting point is about 3300-degrees Centigrade.

Therefore, according to the semiconductor device concerning this embodiment, the melting point of plug 16a is beyond the melting point of phase change film 10b. Phase change film 10b goes back and forth the two phase of an amorphous state and a crystalline substance state by heat application, and when the melting point of plug 16a is lower than the melting point of phase change film 10b, plug 16a may deteriorate with heat. However, when the melting point of plug 16a is beyond the melting point of phase change film 10b, plug 16a will not deteriorate easily due to heat. Since plug 16a functions as a buffer part of heat conduction, the heat conduction to the upper wiring 17 of plug 16a can also be suppressed.

Since a copper melting point is about 1000-degrees Centigrade, also in the semiconductor device concerning Embodiment 2, the melting point of plug 16 is beyond the melting point of phase change film 10b, and there is the same effect as this embodiment. However, plug 16a of high melting point metals, such as tungsten with a higher melting point, tends to acquire the effect which this embodiment has.

This embodiment is applicable also not only in the plug for via holes which connects between the upper wirings but in a plug for contact like plug 8 which connects a multi-layer structure with one side of source or drain 3.

Embodiment 4

This embodiment is a modification of the semiconductor device concerning Embodiment 3. The multi-layer structure of phase change film 10b and electric conduction film 11a in Embodiment 3 is not used as a wiring with which it connects with MISFET, but is used as a detour of the upper wiring.

Figure 20:
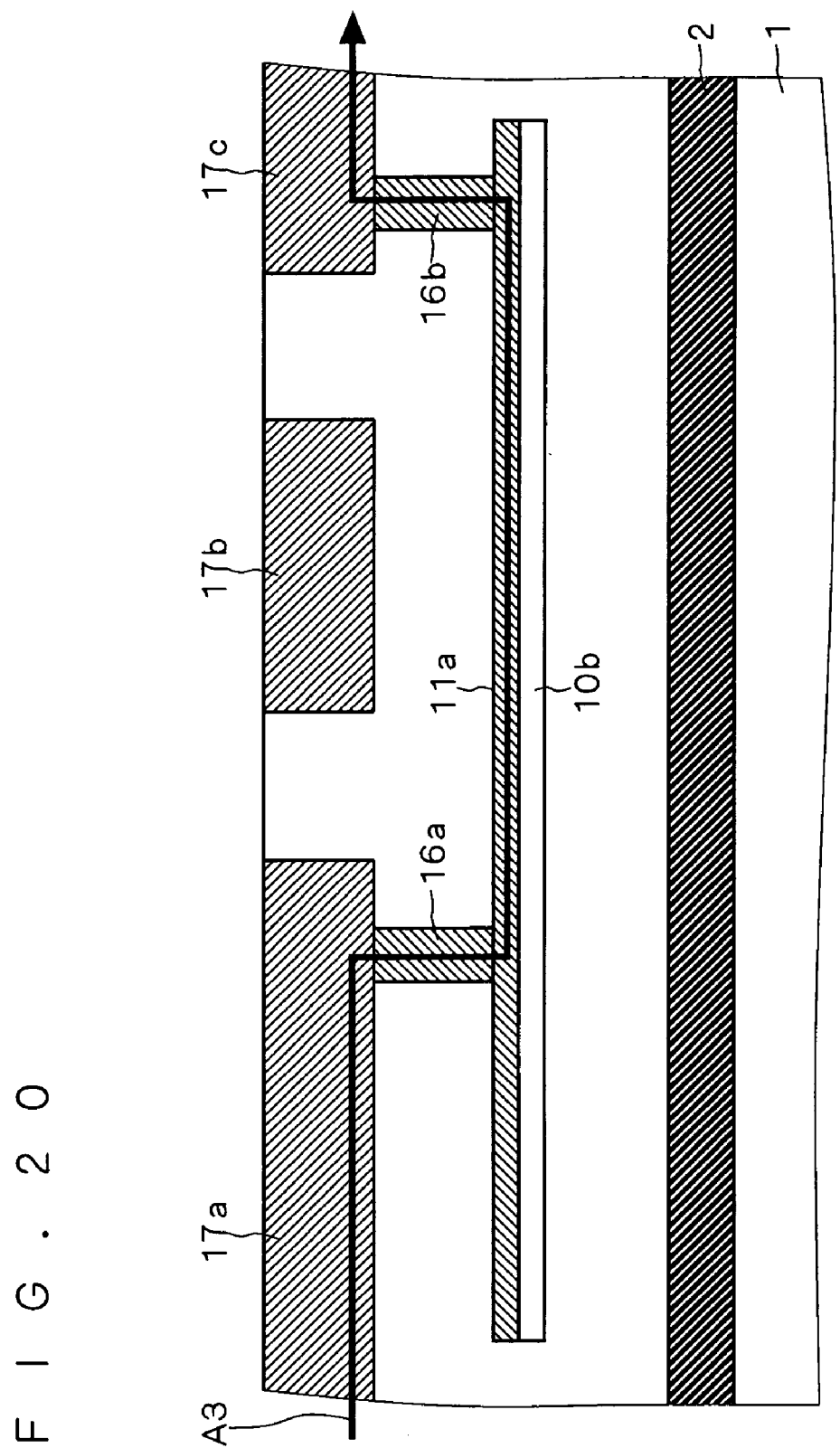
FIG. 20 is a cross-sectional view showing the semiconductor device concerning Embodiment 4.

FIG. 20 is a cross-sectional view showing the semiconductor device concerning this embodiment. As shown in FIG. 20, MISFET under the multi-layer structure of phase change film 10b and electric conduction film 11a is deleted, and, on the other hand, this semiconductor device has wiring 17b which exists only on the multi-layer structure of phase change film 10b and electric conduction film 11a. This semiconductor device has wirings 17a and 17c electrically connected to the multi-layer structure of phase change film 10b and electric conduction film 11a, and has a plurality of plugs 16a and 16b connected to one main surface of electric conduction film 11a which connects electric conduction film 11a, and wirings 17a and 17c, respectively.

In this embodiment, the multi-layer structure of phase change film 10b and electric conduction film 11a has a function as a detour of wiring 17b. That is, the multi-layer structure of phase change film 10b and electric conduction film 11a functions as a wiring for current A3 which flows between wirings 17a and 17c not to flow through wiring 17b.

Here, according to the semiconductor device of this embodiment, each of a plurality of plugs 16a and 16b is connected to one main surface of electric conduction film 11a. Therefore, when current A3 flows between a plurality of plugs 16a and 16b concerned, current mainly flows into electric conduction film 11a of the rate of low resistance, and it is hard to flow through current in the direction which penetrates phase change film 10b of high resistivity. Since it is hard to flow through current in the direction which penetrates phase change film 10b, it is not necessary to restrict the value of current A3 between a plurality of plugs 16a and 16b concerned, or to take into consideration reduction of the current signal by resistance of phase change film 10b so that the phase change of phase change film 10b may not happen.

Embodiment 5

This embodiment is a modification of the semiconductor device concerning Embodiment 1 and 3. The shunt wiring which electrically connects in at least two points with the multi-layer structure of phase change film 10b and electric conduction film 11a which is a source line for memory cells in Embodiment 1, and to which the plug of the high melting point metal in Embodiment 3 was connected, and which has specific resistance lower than the specific resistance of the multi-layer structure concerned is added.

Figure 21:
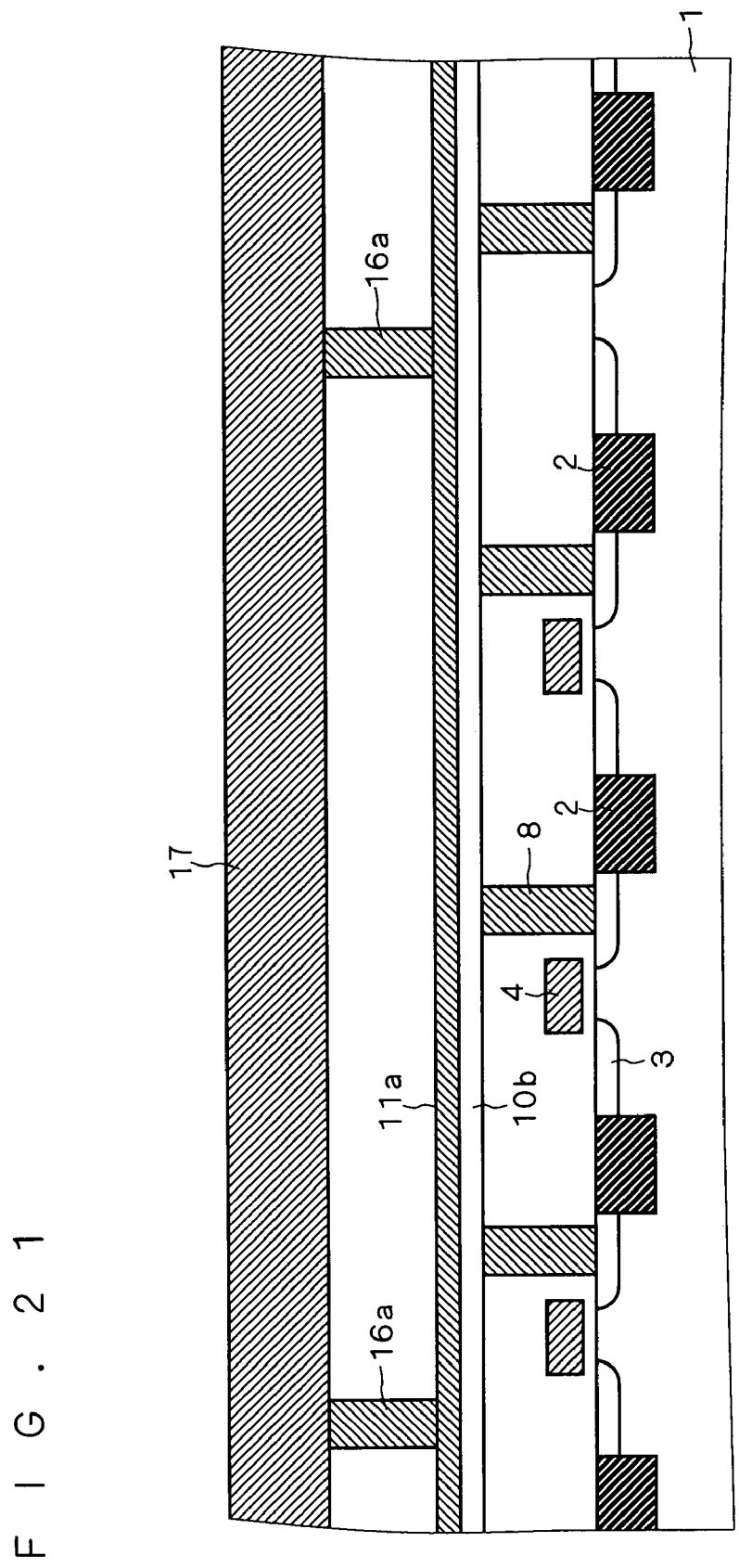
FIG. 21 is a cross-sectional view showing the semiconductor device concerning Embodiment 5.

FIG. 21 is a cross-sectional view showing the semiconductor device concerning this embodiment. This semiconductor device is provided with a plurality of MISFET which has semiconductor substrates 1, such as a silicon substrate, a plurality of element isolation films 2 formed in the front surface, such as a silicon oxide film, and a source and drain 3 and gate 4, respectively like the semiconductor device of FIG. 19. This semiconductor device also has plug 8 connected to one side of source and drain 3 of each MISFET, phase change film 10b connected to plug 8, electric conduction film 11a laminated on phase change film 10b, plugs 16a and 16b for via holes of the high melting point metal connected to electric conduction film 11a, and shunt wiring 17 of the copper connected to plugs 16a and 16b etc.

In at least two points, it electrically connects with the multi-layer structure of phase change film 10b and electric conduction film 11a via plug 16a, and this shunt wiring 17 has specific resistance lower than the specific resistance of the whole multi-layer structure.

Therefore, it is a case where the multi-layer structure of phase change film 10b and electric conduction film 11a is used as a source line, and only by electric conduction film 11a, when resistance reduction is insufficient, the signal of a source line can be detoured with shunt wiring 17, and it can transmit.

What is claimed is:

1. A semiconductor device which includes a memory cell, comprising:
   a semiconductor substrate which has a front surface;
   a first isolation film formed in the front surface of the semiconductor substrate and extended in the first direction;
   a second isolation film formed in the front surface of the semiconductor substrate and extended in the first direction;
   a third isolation film formed in the front surface of the semiconductor substrate and extended in the first direction;
   a first ion implanted region formed in the front surface of the semiconductor substrate and formed between the first isolation film and the second isolation film;
   a second ion implanted region formed in the front surface of the semiconductor substrate and formed between the first isolation film and the second isolation film;
   a third ion implanted region formed in the front surface of the semiconductor substrate and formed between the second isolation film and the third isolation film;
   a fourth ion implanted region formed in the front surface of the semiconductor substrate and formed between the second isolation film and the third isolation film;
   a conductive film formed over the first isolation film, the second isolation film, and the third isolation film, and formed between an upper region of the first ion implanted region and an upper region of the second ion implanted region, and formed between an upper region of the third ion implanted region and an upper region of the fourth ion implanted region, and extended in the second direction which is perpendicular to the first direction;
   a phase change film formed over the first isolation film, the second isolation film, and the third isolation film, and extended in the second direction;
   an electric conduction film formed on the phase change film and extended in the second direction;
   a first metallic film formed over the front surface of the semiconductor substrate and extended in the first direction;
   a second metallic film formed over the front surface of the semiconductor substrate and extended in the first direction;
   a first plug connecting the first metallic film and the first ion implanted region;
   a second plug connecting the phase change film and the second ion implanted region;
   a third plug connecting the second metallic film and the third ion implanted region; and
   a fourth plug connecting the phase change film and the fourth ion implanted region.

2. A semiconductor device according to claim 1, wherein the first metallic film and the second metallic film are formed over the phase change film.

3. A semiconductor device according to claim 1, wherein the first ion implanted region is a drain, the second ion implanted region is a source, the third ion implanted region is a drain, and the fourth ion implanted region is a source.

4. A semiconductor device according to claim 3, wherein the conductive film is a silicon gate.

5. A semiconductor device which includes a memory cell, comprising:
- a semiconductor substrate which has a front surface;
- a first isolation film formed in the front surface of the semiconductor substrate and extended in the first direction;
- a second isolation film formed in the front surface of the semiconductor substrate and extended in the first direction;
- a third isolation film formed in the front surface of the semiconductor substrate and extended in the first direction;
- a first ion implanted region formed in the front surface of the semiconductor substrate and formed between the first isolation film and the second isolation film;
- a second ion implanted region formed in the front surface of the semiconductor substrate and formed between the first isolation film and the second isolation film;
- a third ion implanted region formed in the front surface of the semiconductor substrate and formed between the second isolation film and the third isolation film;
- a fourth ion implanted region formed in the front surface of the semiconductor substrate and formed between the second isolation film and the third isolation film;
- a fifth ion implanted region formed in the front surface of the semiconductor substrate and formed between the first isolation film and the second isolation film;
- a sixth ion implanted region formed in the front surface of the semiconductor substrate and formed between the first isolation film and the second isolation film;
- a seventh ion implanted region formed in the front surface of the semiconductor substrate and formed between the second isolation film and the third isolation film;
- an eighth ion implanted region formed in the front surface of the semiconductor substrate and formed between the second isolation film and the third isolation film;
- a first conductive film formed over the first isolation film, the second isolation film, and the third isolation film, and formed between an upper region of the first ion implanted region and an upper region of the second ion implanted region, and formed between an upper region of the third ion implanted region and an upper region of the fourth ion implanted region, and extended in the second direction which is perpendicular to the first direction;
- a second conductive film formed over the first isolation film, the second isolation film, and the third isolation film, and formed between an upper region of the second ion implanted region and an upper region of the fifth ion implanted region, and formed between an upper region of the fourth ion implanted region and an upper region of the seventh ion implanted region, and extended in the second direction;
- a third conductive film formed over the first isolation film, the second isolation film, and the third isolation film, and formed between an upper region of the fifth ion implanted region and an upper region of the sixth ion implanted region, and formed between an upper region of the seventh ion implanted region and an upper region of the eighth ion implanted region, and extended in the second direction;
- a phase change film formed over the first isolation film, the second isolation film, and the third isolation film, and extended in the second direction;
- an electric conduction film formed on the phase change film and extended in the second direction;
- a first metallic film formed over the front surface of the semiconductor substrate and extended in the first direction;
- a second metallic film formed over the front surface of the semiconductor substrate and extended in the first direction;
- a first plug connecting the first metallic film and the first ion implanted region;
- a second plug connecting the phase change film and the second ion implanted region;
- a third plug connecting the second metallic film and the third ion implanted region;
- a fourth plug connecting the phase change film and the fourth ion implanted region;
- a fifth plug connecting the phase change film and the fifth ion implanted region;
- a sixth plug connecting the first metallic film and the sixth ion implanted region;
- a seventh plug connecting the phase change film and the seventh ion implanted region; and
- an eighth plug connecting the second metallic film and the eighth ion implanted region.

6. A semiconductor device according to claim 5, wherein the first metallic film and the second metallic film are formed over the phase change film.

7. A semiconductor device according to claim 6, wherein the first ion implanted region is a drain, the second ion implanted region is a source, the third ion implanted region is a drain, the fourth ion implanted region is a source, the fifth ion implanted region is a source, the sixth ion implanted region is a drain, the seventh ion implanted region is a source, and the eighth ion implanted region is a drain.

8. A semiconductor device according to claim 7, wherein the first conductive film is a first silicon gate, the second conductive film is a second silicon gate, and the third silicon gate is a third silicon gate.

* * * * *